(12) United States Patent
Le Moing

(10) Patent No.: US 10,550,958 B2
(45) Date of Patent: Feb. 4, 2020

(54) HOUSING COVER SEALING DETECTION MEANS ON A VALVE CONTROL HEAD

(71) Applicant: Honeywell International Inc., Morris Plains, NJ (US)

(72) Inventor: Christophe Le Moing, Montbonnot (FR)

(73) Assignee: Honeywell International Inc., Morris Plains, NJ (US)

( * ) Notice: Subject to any disclaimer, the term of this patent is extended or adjusted under 35 U.S.C. 154(b) by 11 days.

(21) Appl. No.: 15/434,657

(22) Filed: Feb. 16, 2017

(65) Prior Publication Data

US 2018/0231142 A1    Aug. 16, 2018

(51) Int. Cl.
*F16K 37/00* (2006.01)
*G01R 33/09* (2006.01)

(52) U.S. Cl.
CPC ...... *F16K 37/0033* (2013.01); *F16K 37/0041* (2013.01); *G01R 33/091* (2013.01)

(58) Field of Classification Search
CPC .. F16K 37/0033; F16K 35/16; F16K 37/0041; F16K 37/0083; F16K 37/0025;
(Continued)

(56) References Cited

U.S. PATENT DOCUMENTS

| | | | | |
|---|---|---|---|---|
| 1,952,397 | A | * | 3/1934 | Turner ................ F16K 37/0041 137/554 |
| 2,026,221 | A | * | 12/1935 | Derby .................... G08B 17/00 137/554 |

(Continued)

FOREIGN PATENT DOCUMENTS

| | | |
|---|---|---|
| CN | 10273247 A | 9/2008 |
| CN | 101300461 A | 11/2008 |

(Continued)

OTHER PUBLICATIONS

Extended Search Report in related European Application No. 18156633.2; dated Jul. 4, 2018, 8 pages.
(Continued)

*Primary Examiner* — Reinaldo Sanchez-Medina
*Assistant Examiner* — Nicole Gardner
(74) *Attorney, Agent, or Firm* — Craige Thompson; Thompson Patent Law

(57) ABSTRACT

Embodiments relate generally to systems and methods for monitoring and indicating the sealing of a pneumatic valve. A method may comprise detecting a position of a first magnet, wherein the first magnet is fixed to a housing cover of the pneumatic valve; comparing the detected position of the first magnet with a predetermined optimum position of the first magnet, wherein the optimum position is the position of the first magnet when there is a sufficient seal between the housing cover and a housing base of the pneumatic valve; when the detected position of the first magnet is not within a threshold of the optimum position of the first magnet, indicating an insufficient seal between the housing cover and the housing base; and when the detected position of the first magnet is within a threshold of the optimum position of the first magnet, continuing normal operation of the pneumatic valve.

7 Claims, 1 Drawing Sheet

(58) Field of Classification Search
CPC ............. G01R 33/091; Y10T 137/8242; Y10T 137/8275
See application file for complete search history.

(56) References Cited

U.S. PATENT DOCUMENTS

| | | | | |
|---|---|---|---|---|
| 3,719,203 | A | * | 3/1973 | Wettre ................ F16K 37/0033 137/554 |
| 4,696,325 | A | * | 9/1987 | Magee .................. A62C 37/00 137/552 |
| 4,831,350 | A | * | 5/1989 | Rose ................... F16K 37/0033 335/205 |
| 4,967,792 | A | * | 11/1990 | Magee ................ F16K 37/0033 137/552 |
| 5,031,660 | A | * | 7/1991 | Magee ................ F16K 37/0041 137/554 |
| 5,351,028 | A | | 9/1994 | Krahn |
| 5,497,082 | A | | 3/1996 | Hancock |
| 5,589,769 | A | | 12/1996 | Krahn |
| 5,596,272 | A | | 1/1997 | Busch |
| 6,097,183 | A | | 8/2000 | Goetz et al. |
| 6,160,395 | A | | 12/2000 | Goetz et al. |
| 6,509,732 | B1 | | 1/2003 | Rhodes et al. |
| 6,833,697 | B2 | | 12/2004 | Van Ostrand et al. |
| 7,030,604 | B1 | | 4/2006 | Dmytriw et al. |
| 7,112,962 | B2 | | 9/2006 | Ricks et al. |
| 7,126,330 | B2 | | 10/2006 | Peczalski et al. |
| 7,145,326 | B2 | | 12/2006 | Rhodes et al. |
| 7,173,414 | B2 | | 2/2007 | Ricks et al. |
| 7,358,722 | B2 | | 4/2008 | Peczalski et al. |
| 7,408,343 | B2 | | 8/2008 | Dmytriw et al. |
| 7,515,019 | B2 | | 4/2009 | Muniraju et al. |
| 8,018,223 | B2 | | 9/2011 | Latoria et al. |
| 8,125,217 | B2 | | 2/2012 | Dmytriw et al. |
| 8,899,264 | B2 | | 12/2014 | Young et al. |
| 9,303,786 | B2 | | 4/2016 | Le Moing et al. |
| 9,360,345 | B2 | | 6/2016 | Fox |
| 2007/0096723 | A1 | | 5/2007 | Rieger et al. |
| 2008/0128453 | A1 | * | 6/2008 | Burckholter ............. B67D 7/34 222/75 |
| 2009/0259609 | A1 | | 10/2009 | Dmytriw |
| 2010/0097051 | A1 | | 4/2010 | Bussan |
| 2011/0090488 | A1 | | 4/2011 | Andersen et al. |
| 2011/0127994 | A1 | | 6/2011 | Dmytriw et al. |
| 2013/0015845 | A1 | | 1/2013 | Fox |
| 2014/0305525 | A1 | | 10/2014 | Le Moing et al. |

FOREIGN PATENT DOCUMENTS

| | | | |
|---|---|---|---|
| CN | 101915590 | A | 12/2010 |
| EP | 1209439 | A2 | 5/2002 |
| EP | 2026171 | A2 | 2/2009 |
| EP | 2792919 | A1 | 10/2014 |
| WO | 1999053266 | A1 | 10/1999 |
| WO | 03044469 | A1 | 5/2003 |
| WO | 2004015375 | A1 | 2/2004 |
| WO | 2005050139 | A2 | 6/2005 |
| WO | 2006044960 | A2 | 4/2006 |
| WO | 2006044960 | A3 | 4/2006 |
| WO | 2006101981 | A1 | 9/2006 |
| WO | 2006101981 | A9 | 12/2007 |
| WO | WO-2016040988 | A1 * | 3/2016 ......... F16K 37/0008 |

OTHER PUBLICATIONS

Communication under Rule 71(3) EPC: Intention to Grant in related Europe Application 18156633.2-1015; dated Apr. 17, 2019; 43 pages.

* cited by examiner

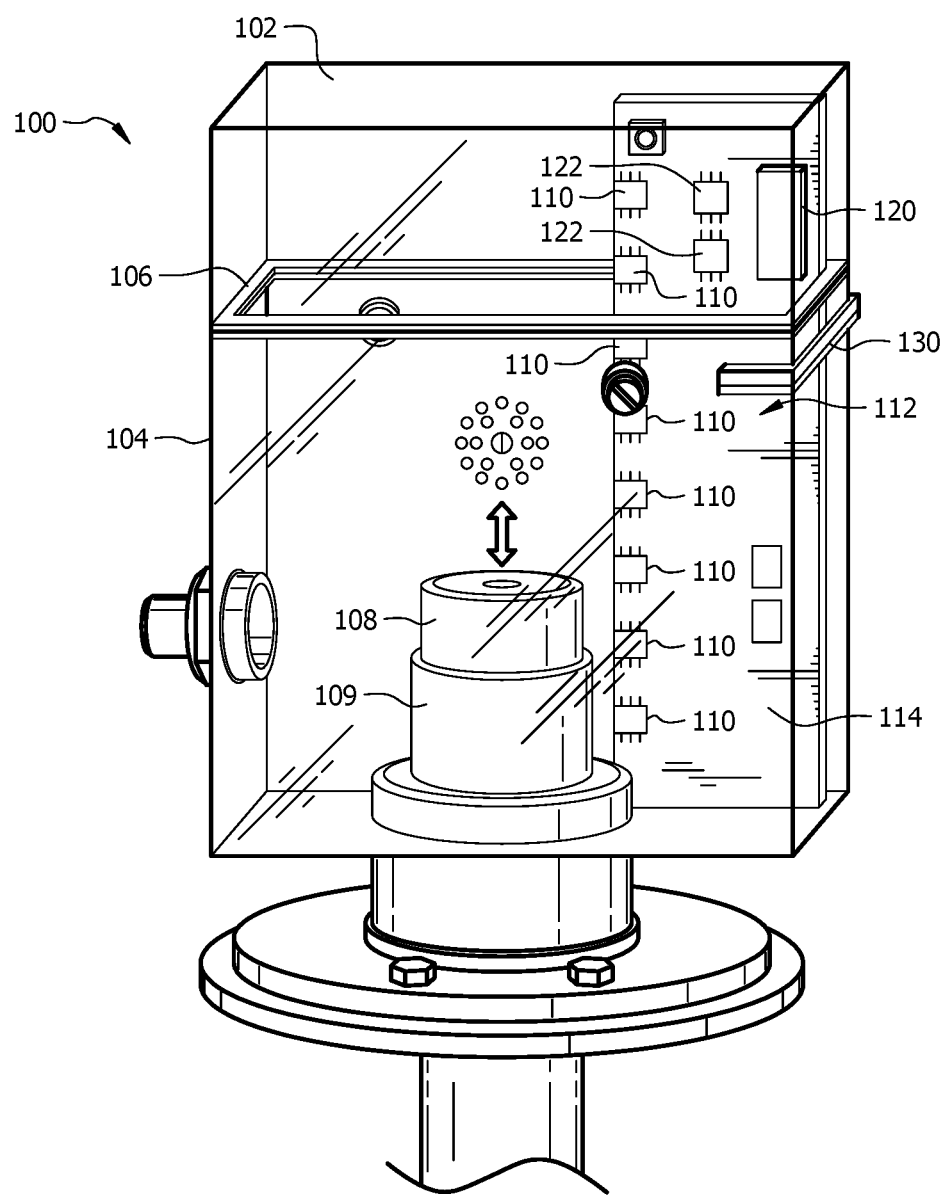

HOUSING COVER SEALING DETECTION MEANS ON A VALVE CONTROL HEAD

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Fluid control valves are used in a wide variety of applications such as oil and gas pipelines and processing lines, as well as food and beverage processing lines. In such applications, maintenance of the valves may be required, both periodic preventative maintenance as well as repair of valve breakdowns to maintain proper function of the valve, thereby reducing losses associated with process fluid leakage and trim damage. Additionally, some industries require valves that may be sterilized while others may require abrasion resistance or chemical resistance. Various industrial processes require valves to be cleanable in-situ so as to minimize the down-time of a valved process line.

SUMMARY

In an embodiment, a method for determining the sealing of a pneumatic valve may comprise detecting a position of a first magnet, wherein the first magnet is fixed to a housing cover of the pneumatic valve; comparing the detected position of the first magnet with a predetermined optimum position of the first magnet, wherein the optimum position is the position of the first magnet when there is a sufficient seal between the housing cover and a housing base of the pneumatic valve; when the detected position of the first magnet is not within a threshold of the optimum position of the first magnet, indicating an insufficient seal between the housing cover and the housing base; and when the detected position of the first magnet is within a threshold of the optimum position of the first magnet, continuing normal operation of the pneumatic valve.

In an embodiment, a pneumatic valve may comprise a housing base; a housing cover comprising a magnet, configured to removably attach to the housing base; at least one magneto-resistive component configured to detect the position of the first magnet; and a controller configured to determine when the position of the magnet indicates a sufficient seal between the housing base and the housing cover.

In an embodiment, a pneumatic valve comprise a housing base; a housing cover comprising a first magnet, configured to removably attach to the housing base; a valve head configured to move vertically within the housing base and the housing cover; a second magnet attached to the valve head, configured to move freely with the movement of the valve head; a magneto-resistive array configured to determine the positions of the first magnet and of the second magnet; and a controller configured to determine when the position of the first magnet indicates a sufficient seal between the housing base and the housing cover.

BRIEF DESCRIPTION OF THE DRAWINGS

For a more complete understanding of the present disclosure, reference is now made to the following brief description, taken in connection with the accompanying drawings and detailed description, wherein like reference numerals represent like parts.

FIG. 1 illustrates a pneumatic valve according to an embodiment of the disclosure.

DETAILED DESCRIPTION

It should be understood at the outset that although illustrative implementations of one or more embodiments are illustrated below, the disclosed systems and methods may be implemented using any number of techniques, whether currently known or not yet in existence. The disclosure should in no way be limited to the illustrative implementations, drawings, and techniques illustrated below, but may be modified within the scope of the appended claims along with their full scope of equivalents.

The following brief definition of terms shall apply throughout the application:

The term "comprising" means including but not limited to, and should be interpreted in the manner it is typically used in the patent context;

The phrases "in one embodiment," "according to one embodiment," and the like generally mean that the particular feature, structure, or characteristic following the phrase may be included in at least one embodiment of the present invention, and may be included in more than one embodiment of the present invention (importantly, such phrases do not necessarily refer to the same embodiment);

If the specification describes something as "exemplary" or an "example," it should be understood that refers to a non-exclusive example;

The terms "about" or "approximately" or the like, when used with a number, may mean that specific number, or alternatively, a range in proximity to the specific number, as understood by persons of skill in the art field; and If the specification states a component or feature "may," "can," "could," "should," "would," "preferably," "possibly," "typically," "optionally," "for example," "often," or "might" (or other such language) be included or have a characteristic, that particular component or feature is not required to be included or to have the characteristic. Such component or feature may be optionally included in some embodiments, or it may be excluded.

Embodiments relate to pneumatic valve applications, possibly for the food and beverage industry. Installation, commissioning and maintenance of the valves require access to the valve control head to complete the work. For example, access may be needed to wire the valve (power-supply, I/O, fluids, etc.), to load the right set of parameters (valve type, stem speed, output configuration, open and close positions, intermediate positions including seat-lift, etc.), to exchange failing components (solenoids, sensors, etc.) and/or to handle any other action required during the lifetime of the valve. Access to the wiring to the different internal components and to the control head graphical user interface (GUI) may be done by removing the valve housing cover. Replacing the housing cover properly is crucial to get the proper sealing of the control head during valve operation. In particular, valves in the food and beverage industry are often cleaned using high pressure water and cleaning agents that could damage the internal components of the valve if the sealing is not adequate. In recent testing, it was determined that up to 92% of failing valve control heads had a root cause linked to the efficiency of the valve cover sealing. In existing valve control heads, there is no means to monitor and ensure that the housing cover has been correctly placed on the valve control head and that the required sealing is achieved. The housing cover may be manually placed by the operator and sealing may be achieved through mechanical constrains applied on an O-ring gasket located between the housing cover and a housing base.

The valve control head housing sealing is a contributor to reliability issues on existing valves. Proper sealing is dependent on the actions of the valve operator. Additionally, valve systems may be damaged when the O-ring is not present. This may happen if the O-ring is lost during product configuration and/or maintenance of the valve system.

Embodiments of the disclosure include systems and methods for monitoring and ensuring proper sealing of the housing components of a pneumatic valve. The valve may comprise a controller configured to provide information on the presence and location of the housing cover, as well as the presence of the gasket and the compression level applied to the gasket.

A system may comprise a pneumatic valve comprising a controller (such as a microprocessor, ASIC, etc.), a valve housing comprising a housing base and a housing cover where sealing is achieved through a gasket located between the housing base and the housing cover, a magnet attached to the housing cover, and an array of one or more magneto-resistive (MR) components defining a detection zone for the magnet.

Referring to FIG. 1, an exemplary embodiment of a valve control head 100 is shown. The valve control head 100 may be a portion of an overall pneumatic valve system. In some embodiments, the valve control head 100 may be referred to as a pneumatic valve. The valve control head 100 may comprise a housing base 104, a housing cover 102, and a gasket 106 located between the housing base 104 and the housing cover 102. The gasket 106 may be configured to provide a seal between the housing base 104 and housing cover 102 when the housing cover 102 is attached to the housing base 104. In the embodiment shown in FIG. 1, some of the components are shown in transparency, such as the housing cover 102 and the housing base 104.

The valve control head 100 may comprise a valve stem 108 configured to move in a vertical direction within the housing base 104 and housing cover 102. The valve stem 108 may comprise a magnet 109 attached to a portion of the valve stem 108. The valve control head 100 may also comprise a magneto-resistive (MR) array 112 comprising a plurality of MR components 110. The MR array 112 may be configured to monitor and indicate the vertical position of the valve stem 108 based on the interaction between the MR array 112 and the magnet 109 attached to the valve stem 108.

In some embodiments of the valve control head 100, the housing cover 102 may comprise a magnet 120. The magnet 120 may be attached to the housing cover 102, molded into the housing cover 102, or otherwise incorporated into the housing cover 102. In some embodiments, the magnet 120 may be incorporated into the walls of the housing cover 102. In some embodiments, the magnet 120 may be attached to the interior of the housing cover 102. In some embodiments, the magnet 120 may be attached to the exterior of the housing cover 102.

Additionally, the MR array 112 may comprise one or more MR components 122 which may allow the MR array 112 to monitor and indicate the position of the housing cover 102 based on the interaction between the MR array 112 and the magnet 120. In some embodiments, the vertical position of the magnet 120 may be monitored to determine if the housing cover 102 has been properly installed onto the housing base 104, with the gasket 106 in place between the housing cover 102 and housing base 104. For example, if the magnet 120 is located higher vertically (further from the housing base 104) than it should be, this may indicate that the housing cover 102 has not be sufficiently attached to the housing base 104 and/or that the gasket 106 has not been sufficiently compressed. As another example, if the magnet 120 is located lower vertically (closer to the housing base 104) than it should be, this may indicate that the gasket 106 is not in place between the housing cover 102 and the housing base 104.

The magnet 120 may be fixed inside the housing cover 102 in a position that is proximate to the MR array 112 when the housing cover 102 properly placed on the housing base 104. The magnet 120 may be positioned on the housing cover 102 in any position where the magnetic field of the magnet 120 may be monitored by the MR components 122 of the MR array 112. The housing cover 102 may be attached to the housing base 104 through any number of attachment means. The housing cover 102 may be attached to the housing base 104 using screws that fit through the housing cover 102 into to the housing base 104. Alternatively, the housing cover 102 and housing base 104 may comprise threaded sections, wherein the housing cover 102 may be threaded onto the housing base 104. Alternatively, the housing cover 102 may be attached to the housing base 104 using a bayonet or any other type of indexation of the top on the housing base 104.

The valve control head 100 may also comprise a controller 114, such as a printed circuit board, which may control and communicate with the MR array and/or other components or sensors within the valve control head 100. The controller 114 may extract the precise position of the magnet 120 from the outputs of the MR component(s) 122. The controller 114 may compare any detected position of the magnet 120 to a predetermined optimum position (which may be stored in a memory of the controller 114) for the proper positioning of the magnet 120 (and therefore the housing cover 102) plus any acceptable tolerance in the measurement. The controller 114 may report a first level of maintenance alert if the magnet 120 (and therefore the housing cover 102) is not detected. The controller 114 may report a second level of maintenance alert if the magnet 120 (and therefore the housing cover 102) is detected but the gasket 106 has not been compressed to an acceptable level. The MR components 122 may comprise two MR components, where the spacing between the two MR components 122 is adapted to meet the required accuracy on measurement of the constraints applied on the gasket (e.g. 0.01 mm).

In some embodiments, the controller 114 that is used to monitor the outputs of the MR components 122, extract a magnet 120 position out of these outputs, and compare this position to a stored optimum position is the same controller 114 that is used to achieve all other valve control functions. In some embodiments, the two magneto-resistive components 122 that are used to detect absence or presence of the housing cover 102 and magnet 120 are part of the MR array 112 used to detect the position of the valve stem magnet 109.

In some pneumatic valves, a first zone of the MR array 112 is used to monitor "open" positions of the valve stem 108, a second zone of the MR array 112 is used to monitor "closed" positions of the valve stem 108, and an intermediate third zone of the MR array 112 is not used. The availability of this intermediate third zone could allow for monitoring of the proper positioning of the housing cover 102 and magnet 120. In this case, the magnetic environment would need to be carefully laid out to avoid any mutual disturbances from the two magnets 109 and 120 within the detection field of the MR array 112.

In some embodiments, the valve control head 100 may comprise an indicator 130, such as an LED, which may comprise different colors and modes for indicating different alerts to a user. The controller 114 may activate and control the indicator 130. The indicator 130 may be positioned anywhere on the valve control head 100, possibly around the circumference of the housing base 104 and/or housing cover 102 so that the indicator 130 may be easily viewed by a user. The indicator 130 may output colors and flashing modes to indicate different states of the valve 100. For example, a first lighting mode may indicate that the valve control head 100 may be in a set-up or teach-in mode and the cover is removed, a second lighting mode may indicate that the valve control head 100 may be in run mode and the cover is still removed, a third lighting mode may indicate that the cover is attached incorrectly, and a fourth lighting mode may indicate that the cover is attached correctly. Additionally, the indicator 130 may comprise multiple lighting modes to indicate that the cover is attached incorrectly, wherein the different lighting modes may indicate difference issues with the attachment.

In some embodiments, detecting the absence or presence of the housing cover may be used as a safety function for the valve operation. The moving valve stem 108 can cause injury if it is exposed, so the valve stem 108 may be prevented from moving unless the housing cover 102 is detected as being in the proper position. Additionally, the movement of the valve stem 108 may be stopped if the magnet 120 is no longer detected. These methods could provide a safety measure that does not exist in typical pneumatic valves. In some embodiments, the housing cover 102 could comprise a window, a trap or any other access solution to the wiring and configuration means.

In a first embodiment, a method for determining the sealing of a pneumatic valve may comprise detecting a position of a first magnet, wherein the first magnet is fixed to a housing cover of the pneumatic valve; comparing the detected position of the first magnet with a predetermined optimum position of the first magnet, wherein the optimum position is the position of the first magnet when there is a sufficient seal between the housing cover and a housing base of the pneumatic valve; when the detected position of the first magnet is not within a threshold of the optimum position of the first magnet, indicating an insufficient seal between the housing cover and the housing base; and when the detected position of the first magnet is within a threshold of the optimum position of the first magnet, continuing normal operation of the pneumatic valve.

A second embodiment can include the method of the first embodiment, further comprising, when the detected position of the first magnet is in a first direction from the optimum position, indicating that the housing cover is not properly attached to the housing base.

A third embodiment can include the method of the first or second embodiments, further comprising, before detecting the position of the first magnet, attaching the housing cover to the housing base.

A fourth embodiment can include the method of any of the first to third embodiments, wherein a gasket is positioned between the housing cover and housing base.

A fifth embodiment can include the method of the fourth embodiment, further comprising, when the detected position is in a second direction from the optimum position, indicating that the gasket is missing from between the housing cover and the housing base.

A sixth embodiment can include the method of any of the first to fifth embodiments, further comprising, before detecting the position of the first magnet, removing the housing cover to access the internal components of the pneumatic valve; and reattaching the housing cover to the housing base.

A seventh embodiment can include the method of any of the first to sixth embodiments, further comprising defining a detection zone for the first magnet, wherein detecting the position of the first magnet comprises detecting that the first magnet has entered the detection zone.

An eighth embodiment can include the method of any of the first to seventh embodiments, wherein indicating an insufficient seal between the housing cover and the housing base comprises activating an alert on the pneumatic valve.

A ninth embodiment can include the method of any of the first to eighth embodiments, wherein detecting the position of the first magnet comprises detecting the magnetic field of the magnet by at least one magneto-resistive component.

A tenth embodiment can include the method of any of the first to ninth embodiments, further comprising detecting the position of a second magnet attached to a valve head within the pneumatic valve.

A eleventh embodiment can include the method of any of the first to tenth embodiments, wherein detecting the position of the first magnet comprises detecting the magnetic field of the first magnet by at least one magneto-resistive component, and wherein detecting the position of the second magnet comprises detecting the magnetic field of the second magnet by a separate at least one magneto-resistive component.

A twelfth embodiment can include the method of the first to eleventh embodiments, further comprising preventing movement of a valve stem within the valve when an insufficient seal between the housing cover and the housing base is indicated.

In a thirteenth embodiment, a pneumatic valve may comprise a housing base; a housing cover comprising a magnet, configured to removably attach to the housing base; at least one magneto-resistive component configured to detect the position of the first magnet; and a controller configured to determine when the position of the magnet indicates a sufficient seal between the housing base and the housing cover.

A fourteenth embodiment can include the pneumatic valve of the thirteenth embodiment, further comprising a gasket located between the housing base and housing cover, configured to seal the housing base to the housing cover.

A fifteenth embodiment can include the pneumatic valve of the thirteenth or fourteenth embodiments, further comprising an indicator, wherein the controller activates the indicator when the position of the magnet does not indicate a sufficient seal between the housing base and the housing cover.

A sixteenth embodiment can include the pneumatic valve of any of the thirteenth to fifteenth embodiments, wherein the at least one magneto-resistive component comprises a plurality of magneto-resistive components configured to detect the magnetic field of the magnet.

In seventeenth embodiment, a pneumatic valve comprise a housing base; a housing cover comprising a first magnet, configured to removably attach to the housing base; a valve head configured to move vertically within the housing base and the housing cover; a second magnet attached to the valve head, configured to move freely with the movement of the valve head; a magneto-resistive array configured to determine the positions of the first magnet and of the second magnet; and a controller configured to determine when the position of the first magnet indicates a sufficient seal between the housing base and the housing cover.

An eighteenth embodiment can include the pneumatic valve of the seventeenth embodiment, wherein the magneto-resistive array comprises a first set of magneto-resistive components configured to determine the position of the first magnet, and a second set of magneto-resistive components configured to determine the position of the second magnet.

A nineteenth embodiment can include the pneumatic valve of the seventeenth or eighteenth embodiments, wherein the controller is configured to, when the detected position of the first magnet is in a first direction from the optimum position, indicate that the housing cover is not properly attached to the housing base.

A twentieth embodiment can include the pneumatic valve of any of the seventeenth to nineteenth embodiments, further comprising a gasket positioned between the housing cover and housing base.

A twenty-first embodiment can include the pneumatic valve of any of the seventeenth to twentieth embodiments, wherein the controller is configured to, when the detected position is in a second direction from the optimum position, indicate that the gasket is missing from between the housing cover and the housing base.

While various embodiments in accordance with the principles disclosed herein have been shown and described above, modifications thereof may be made by one skilled in the art without departing from the spirit and the teachings of the disclosure. The embodiments described herein are representative only and are not intended to be limiting. Many variations, combinations, and modifications are possible and are within the scope of the disclosure. Alternative embodiments that result from combining, integrating, and/or omitting features of the embodiment(s) are also within the scope of the disclosure. Accordingly, the scope of protection is not limited by the description set out above, but is defined by the claims which follow, that scope including all equivalents of the subject matter of the claims. Each and every claim is incorporated as further disclosure into the specification and the claims are embodiment(s) of the present invention(s). Furthermore, any advantages and features described above may relate to specific embodiments, but shall not limit the application of such issued claims to processes and structures accomplishing any or all of the above advantages or having any or all of the above features.

Additionally, the section headings used herein are provided for consistency with the suggestions under 37 C.F.R. 1.77 or to otherwise provide organizational cues. These headings shall not limit or characterize the invention(s) set out in any claims that may issue from this disclosure. Specifically and by way of example, although the headings might refer to a "Field," the claims should not be limited by the language chosen under this heading to describe the so-called field. Further, a description of a technology in the "Background" is not to be construed as an admission that certain technology is prior art to any invention(s) in this disclosure. Neither is the "Summary" to be considered as a limiting characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of the claims shall be considered on their own merits in light of this disclosure, but should not be constrained by the headings set forth herein.

Use of broader terms such as "comprises," "includes," and "having" should be understood to provide support for narrower terms such as "consisting of," "consisting essentially of," and "comprised substantially of." Use of the terms "optionally," "may," "might," "possibly," and the like with respect to any element of an embodiment means that the element is not required, or alternatively, the element is required, both alternatives being within the scope of the embodiment(s). Also, references to examples are merely provided for illustrative purposes, and are not intended to be exclusive.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted or not implemented.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

What is claimed is:

1. A pneumatic valve comprising:
   a housing base;
   a housing cover comprising a first magnet, configured to removably attach to the housing base;
   at least one magneto-resistive component coupled to the housing base, wherein the at least one magneto-resistive component is configured to generate an output signal indicative of a position of the first magnet;
   a gasket located between the housing base and the housing cover, configured to seal the housing base to the housing cover; and
   a controller configured to:
   determine the position of the first magnet based on the output signal received from the at least one magneto-resistive component,
   compare the determined position of the first magnet with a predetermined optimum position to determine one or more states of the housing cover, wherein the one or more states correspond to:
   a first state, when the determined position of the first magnet is within a threshold of the predetermined optimum position, indicates a sufficient seal between the housing base and the housing cover, a second state, when the determined position of the first magnet is in a first direction from the predetermined optimum position, indicates that the housing cover is not properly attached to the housing base, and a third state, when the determined position of the first magnet is in a second direction from the predetermined optimum position, indicates that the gasket is missing between the housing cover and the housing base.

2. The pneumatic valve of claim 1, wherein the at least one magneto-resistive component comprises a plurality of magneto-resistive components configured to detect a magnetic field of the first magnet.

3. The pneumatic valve of claim 1, further comprising a detection zone, defined by the at least one magneto-resistive component, wherein the detection zone defines a zone for detecting the position of the first magnet.

4. The pneumatic valve of claim 1, further comprising a second magnet, attached to a valve head configured to move between the housing base and housing cover, wherein the controller is configured to detect a position of the second magnet, based on an output signal received from a separate at least one magneto-resistive component, indicative of a position of the valve head.

5. The pneumatic valve of claim 1, wherein the controller is further configured to prevent a movement of a valve head, when the first magnet is not determined to be positioned within the threshold of the predetermined optimum position.

6. The pneumatic valve of claim 1, wherein the controller is further configured to stop the movement of a valve head, when the first magnet is determined to be missing based on the output signal received from the at least one magneto-resistive component.

7. The pneumatic valve of claim 1, wherein the one or more states comprises a fourth state, when the determined position of the first magnet is not within the threshold of the predetermined optimum position, indicating an insufficient seal between the housing cover and housing base.

* * * * *